(12) United States Patent
Takahashi et al.

(10) Patent No.: US 9,589,812 B2
(45) Date of Patent: *Mar. 7, 2017

(54) FABRICATION METHOD OF SEMICONDUCTOR PIECE

(71) Applicant: FUJI XEROX CO., LTD., Tokyo (JP)

(72) Inventors: Mutsuya Takahashi, Ebina (JP); Shuichi Yamada, Ebina (JP); Michiaki Murata, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/884,168

(22) Filed: Oct. 15, 2015

(65) Prior Publication Data
US 2016/0133476 A1 May 12, 2016

(30) Foreign Application Priority Data

Nov. 6, 2014 (JP) .................................. 2014-225712
Nov. 25, 2014 (JP) .................................. 2014-237288
Jun. 25, 2015 (JP) .................................. 2015-127757

(51) Int. Cl.
*H01L 21/3065* (2006.01)
*H01L 21/304* (2006.01)
(Continued)

(52) U.S. Cl.
CPC ...... *H01L 21/3065* (2013.01); *B81C 1/00531* (2013.01); *B81C 1/00619* (2013.01);
(Continued)

(58) Field of Classification Search
None
See application file for complete search history.

(56) References Cited

U.S. PATENT DOCUMENTS 6,507,092 B1 1/2003 Fukasawa et al.
6,515,309 B1 2/2003 Tohyama et al.
(Continued)

FOREIGN PATENT DOCUMENTS

CN 101471293 A 7/2009
JP H04-67650 A 3/1992
(Continued)

OTHER PUBLICATIONS

Mar. 20, 2015 Office Action issued in Japanese Patent Application No. 2014-237288.
(Continued)

*Primary Examiner* — Jiong-Ping Lu
(74) *Attorney, Agent, or Firm* — Oliff PLC

(57) ABSTRACT

A fabrication method of a semiconductor piece includes forming a groove that has a first groove portion, and a second groove portion which is a groove portion formed to communicate with a lower part of the first groove portion and extends toward a lower part at a steeper angle than an angle of the first groove portion, has a shape without an angle portion between the first groove portion and the second groove portion, is positioned on the front side, and is formed by dry etching; affixing a retention member including an adhesive layer to the surface in which the groove on the front side is formed; thinning the substrate from the back side of the substrate in a state in which the retention member is affixed; and removing the retention member from the surface after the thinning.

10 Claims, 11 Drawing Sheets

ENTRY OF ADHESIVE LAYER

(51) Int. Cl.
  *H01L 21/02*   (2006.01)
  *B81C 1/00*    (2006.01)
  *H01L 21/78*   (2006.01)
  *H01L 21/683*  (2006.01)

(52) U.S. Cl.
  CPC .... *H01L 21/02225* (2013.01); *H01L 21/3043* (2013.01); *H01L 21/6836* (2013.01); *H01L 21/78* (2013.01); *B81C 2201/0132* (2013.01); *H01L 2221/68327* (2013.01); *H01L 2221/68381* (2013.01)

(56) References Cited

U.S. PATENT DOCUMENTS

| | | | |
|---|---|---|---|
| 2004/0043614 | A1* | 3/2004 | Koizumi .............. H01L 21/78 438/689 |
| 2007/0173035 | A1 | 7/2007 | Izumi |
| 2007/0249178 | A1 | 10/2007 | Ogihara |
| 2009/0317945 | A1 | 12/2009 | Izumi |
| 2010/0081235 | A1* | 4/2010 | Furumura ........ G06K 19/07749 438/113 |
| 2011/0175177 | A1 | 7/2011 | Liou |
| 2012/0322240 | A1 | 12/2012 | Holden et al. |

FOREIGN PATENT DOCUMENTS

| | | |
|---|---|---|
| JP | 2000-195827 A | 7/2000 |
| JP | 2003-124151 A | 4/2003 |
| JP | 2004-095952 A | 3/2004 |
| JP | 2004-333887 A | 11/2004 |
| JP | 2007-294612 A | 11/2007 |
| JP | 2009-088252 A | 4/2009 |
| JP | 2011-077418 A | 4/2011 |
| TW | 473897 B | 1/2002 |
| TW | 200512820 A | 4/2005 |
| TW | 201125807 A | 8/2011 |

OTHER PUBLICATIONS

Sep. 9, 2016 Office Action issued in Taiwanese Patent Application No. 104136340.

\* cited by examiner

FORWARD TAPERED SHAPE

ENTRY OF ADHESIVE LAYER

FORWARD TAPERED SHAPE
AND PERPENDICULAR SHAPE

ENTRY OF ADHESIVE LAYER

REVERSE TAPERED SHAPE

ENTRY OF ADHESIVE LAYER

PERPENDICULAR SHAPE

ENTRY OF ADHESIVE LAYER

FABRICATION METHOD OF SEMICONDUCTOR PIECE

CROSS-REFERENCE TO RELATED APPLICATIONS

This application is based on and claims priority under 35 USC 119 from Japanese Patent Application No. 2014-225712 filed on Nov. 6, 2014 and Japanese Patent Application No. 2014-237288 filed on Nov. 25, 2014.

BACKGROUND

Field

The present invention relates to a fabrication method of a semiconductor piece.

SUMMARY (1) A fabrication method of a semiconductor piece includes:

forming a groove that has a first groove portion whose width is gradually narrowed from a front side of a substrate toward a back side of the substrate, and a second groove portion which is a groove portion formed to communicate with a lower part of the first groove portion and extends toward a lower part at a steeper angle than an angle of the first groove portion, has a shape without an angle portion between the first groove portion and the second groove portion, is positioned on the front side, and is formed by dry etching;

affixing a retention member including an adhesive layer to the front side in which the groove on the front side is formed;

thinning the substrate from the back side of the substrate in a state in which the retention member is affixed; and removing the retention member from the front side after the thinning.

BRIEF DESCRIPTION OF DRAWINGS

FIGS. 7A and 7B are sectional views illustrating a shape of a first microgroove, and FIGS. 7C and 7D are sectional views illustrating a shape of a second microgroove.

FIGS. 8A and 8B are sectional views illustrating a microgroove of a reverse-tapered shape, and FIGS. 8C and 8D are sectional views illustrating a microgroove of a perpendicular shape.

FIG. 9A is a sectional view illustrating a microgroove of a forward tapered shape only, FIGS. 9B and 9C are sectional views illustrating microgrooves that are respectively configured by a forward tapered shape and a perpendicular shape.

DESCRIPTION OF REFERENCE NUMERALS AND SIGNS

Figure 1:
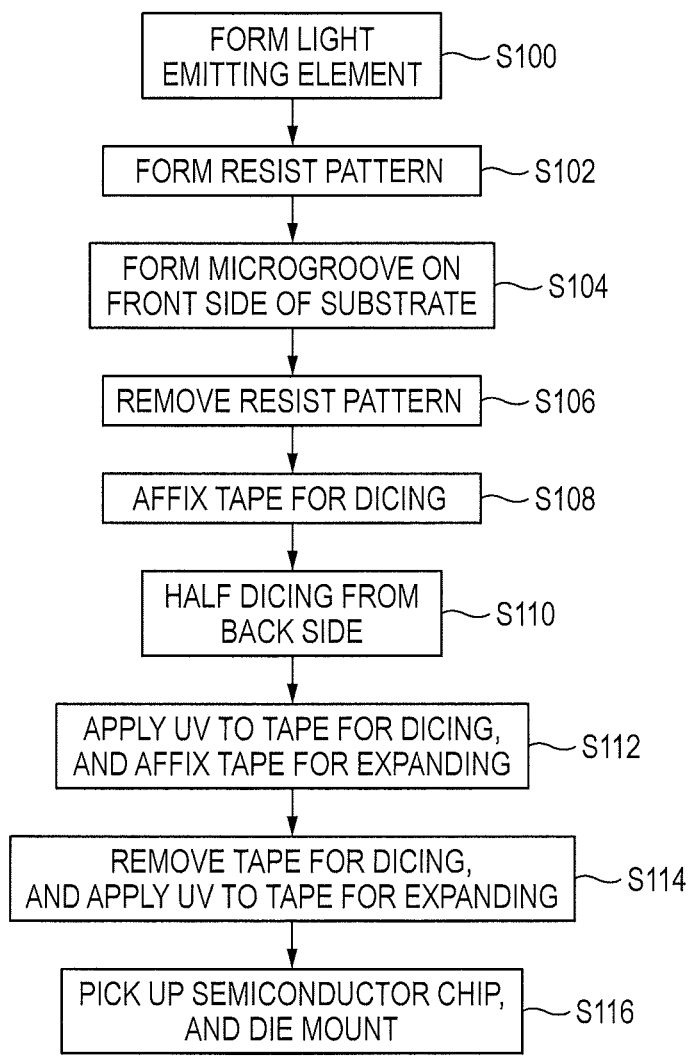
FIG. 1 is a flowchart illustrating an example of a fabrication process of a semiconductor piece according to an example of the present invention.

100: LIGHT EMITTING ELEMENT
120: CUTTING AREA (SCRIBE LINE)
130: RESIST PATTERN
140: MICROGROOVE ON FRONT SIDE
160: TAPE FOR DICING
162: TAPE BASE MEMBER
164: ADHESIVE LAYER
165, 166: UNCURED ADHESIVE LAYER
170: GROOVE ON BACK SIDE
190: TAPE FOR EXPANDING
210: SEMICONDUCTOR CHIP
300: DICING BLADE
400,410: MICROGROOVE
402,404,412,414,412a,414a: SIDE SURFACE
500,510,520,530,540: MICROGROOVE
502,504,512,514,522,524,532,534: SIDE SURFACE
600: PHOTORESIST
610: OPENING
620: GROOVE
630: PROTECTIVE FILM
800: STEP PORTION

DETAILED DESCRIPTION

For example, a fabrication method of a semiconductor piece according to the present invention is applied to a method of dividing (dicing) members with a substrate shape such as a semiconductor wafer in which plural semiconductor elements are formed, and of fabricating each semiconductor piece (semiconductor chip). The semiconductor elements formed on the substrate are not limited to a particular element, and can include a light emitting element, an active element, a passive element, or the like. In a preferred aspect, the fabrication method according to the present invention can be applied to a method of extracting a semiconductor piece including a light emitting element from a substrate, and the light emitting element can be, for example, a surface-emitting type semiconductor laser, a light emitting diode, or a light emitting thyristor. One semiconductor piece may include a single light emitting element, and may include plural light emitting elements which are disposed in an array form. Furthermore, one semiconductor piece can include a drive circuit which drives one light emitting element or plural light emitting elements. In addition, the substrate can be configured by, for example, silicon, SiC, a compound semiconductor, sapphire, or the like. However, the substrate is not limited to this, and a substrate (hereinafter, may be collectively referred to as a semiconductor substrate) including at least a semiconductor may be a substrate which is formed by other materials. In a preferred aspect, the substrate is a semiconductor substrate on which a light emitting element, such as a surface light emitting type semiconductor laser or a light emitting diode is formed, and which is configured by a group III-V compound such as GaAs.

In the following description, a method of extracting each semiconductor piece (semiconductor chip) from a semiconductor substrate on which plural light emitting elements are formed will be described with reference to the accompanying drawings. It should be noted that a scale or a shape of the drawing is emphasized to facilitate understanding of characteristics of the invention, and is not necessarily the same as a scale or a shape of an actual device.

Example

FIG. 1 is a flowchart illustrating an example of a fabrication process of a semiconductor piece according to an example of the present invention. As illustrated in FIG. 1, a fabrication method of a semiconductor piece according to the present example includes step (S100) of forming a light emitting element, step (S102) of forming a resist pattern, step (S104) of forming a microgroove on a front side of a semiconductor substrate, step (S106) of removing the resist pattern, step (S108) of affixing a tape for dicing on the front side of the semiconductor substrate, step (S110) of half dicing a back side of the semiconductor substrate, step (S112) of applying ultraviolet light (UV) to the tape for dicing and affixing a tape for expanding on the back side of the semiconductor substrate, step (S114) of removing the tape for dicing and applying ultraviolet light on the tape for expanding, and step (S116) of picking up a semiconductor piece (semiconductor chip) and die-mounting on a circuit board or the like. The sectional views of the semiconductor substrate illustrated in FIGS. 2A to 2D, and FIGS. 3A to 3E correspond to each of step S100 to step S116.

Figure 2A:
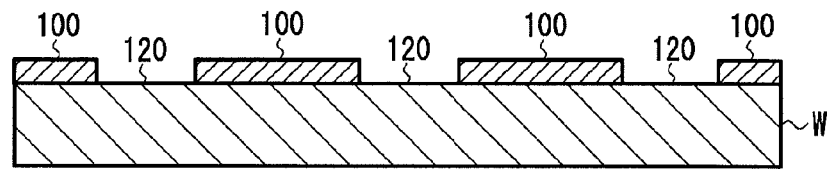
FIGS. 2A to 2D are schematic sectional views of a semiconductor substrate in the fabrication process of the semiconductor piece according to the example of the present invention.

As illustrated in FIG. 2A, in step (S100) of forming a light emitting element, plural light emitting elements 100 are formed in a front side of a semiconductor substrate W that is configured by, for example, GaAs or the like. The light emitting element 100 is, for example, a surface light emitting type semiconductor laser, a light emitting diode, a light emitting thyristor, or the like. It should be noted that, in FIG. 2A, one area is illustrated as the light emitting element 100, but the light emitting element 100 illustrates an element which is included in one semiconductor piece which is diced, and not only one light emitting element, but also plural light emitting elements or other circuit elements can be formed in the area of one of the light emitting elements 100.

Figure 4:
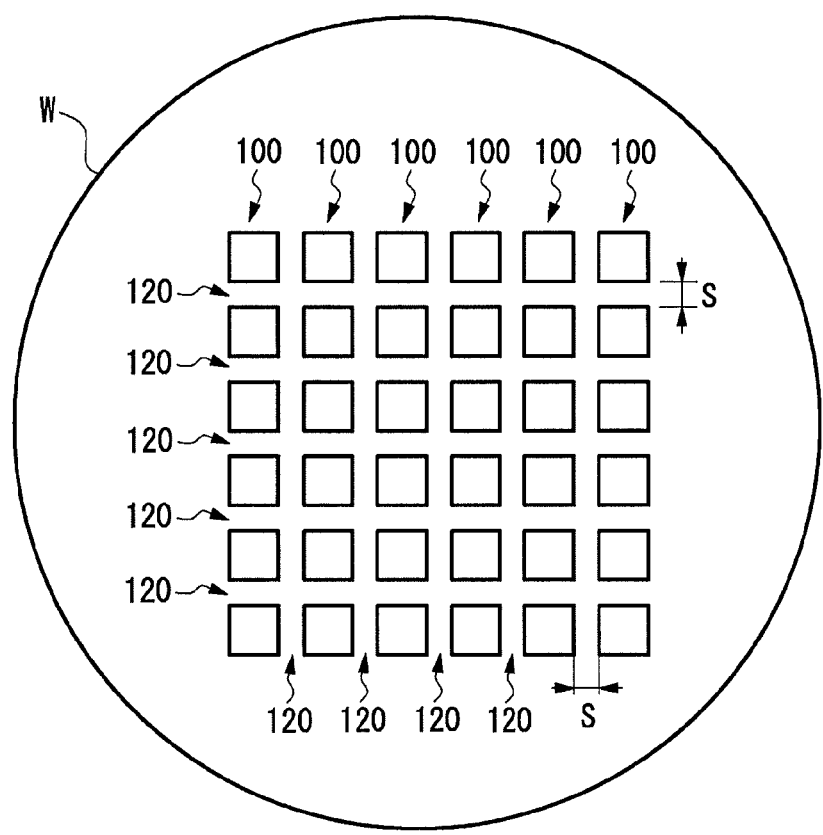
FIG. 4 is a schematic plan view of a semiconductor substrate (wafer) at the time when a circuit formation is completed.

FIG. 4 is a plan view illustrating an example of the semiconductor substrate W at the time when the step of forming the light emitting element is completed. For the sake of convenience, only the light emitting elements 100 are illustrated in the central portion in FIG. 4. On a front side of the semiconductor substrate W, the plural light emitting elements 100 are formed in an array form in a matrix direction. A planar area of the single light emitting element 100 is an approximately rectangular shape, and the light emitting elements 100 are separated from each other in a lattice shape by cutting areas 120 which are defined by scribe lines or the like having a constant interval S.

Figure 2B:
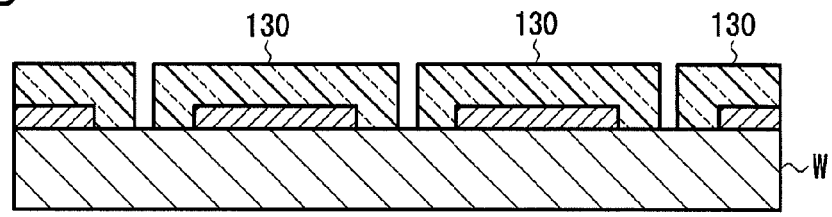

If the formation of the light emitting element is completed, a resist pattern is then formed on the front side of the semiconductor substrate W (S102). As illustrated in FIG. 2B, a resist pattern 130 is worked in such a manner that the cutting areas 120 which are defined by the scribe line or the like of the front side of the semiconductor substrate W are exposed. The work for forming the resist pattern 130 is performed by a photolithography process.

Figure 2C:
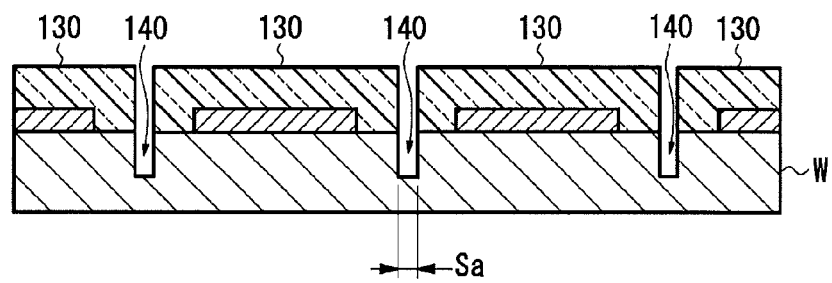

Subsequently, fine grooves are formed on the front side of the semiconductor substrate W (S104). As illustrated in FIG. 2C, the fine groove (hereinafter, for the sake of convenience, referred to as a microgroove or groove on the front side) 140 with a constant depth is formed on the front side of the semiconductor substrate W, using the resist pattern 130 as a mask. The groove can be formed by, for example, dry etching, and it is preferable that the groove is formed by anisotropic plasma etching (reactive ion etching) that is anisotropic dry etching. A width Sa of the microgroove 140 is approximately the same as that of an opening that is formed in the resist pattern 130, and the width Sa of the microgroove 140 is, for example, several μm to a dozen μm. Preferably, the width Sa is approximately 3 μm to approximately 15 μm. In addition, a depth thereof is, for example, approximately 10 μm to approximately 100 μm, and is formed to at least be deeper than that of a functional element such as a light emitting element. Preferably, the depth of the microgroove 140 is approximately 30 μm to approximately 80 μm. If the microgroove 140 is formed by a general dicing blade, the interval S between the cutting areas 120 is a sum of margin widths in which a width of the groove and pitching amount of the dicing blade are taken into account, and becomes large to approximately 40 μm to approximately 80 μm. Meanwhile, in a case in which the microgroove 140 is formed in a semiconductor process, not only the width of the groove is narrowed, but also a margin width for cutting can become narrower than a width in a case of using the dicing blade. In other words, it is possible to reduce the interval S between the cutting areas 120, and for this reason, it is possible to increase the acquired number of semiconductor pieces by disposing the light emitting elements on the wafer at a high density. A "front side" of the present example indicates a surface side on which a functional element such as a light emitting element is formed, and a "back side" indicates a surface side opposite to the "front side".

Figure 2D:
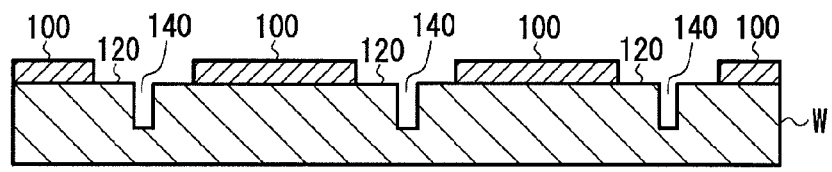

Subsequently, the resist pattern is removed (S106). As illustrated in FIG. 2D, if the resist pattern 130 is removed from the front side of the semiconductor substrate, the microgroove 140 formed along the cutting area 120 is exposed on the front side. A shape of the microgroove 140 will be described in detail later.

Figure 3A:
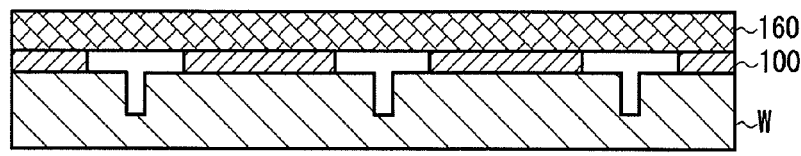
FIGS. 3A to 3E are schematic sectional views of the semiconductor substrate in the fabrication process of the semiconductor piece according to the example of the present invention.
Figure 3B:
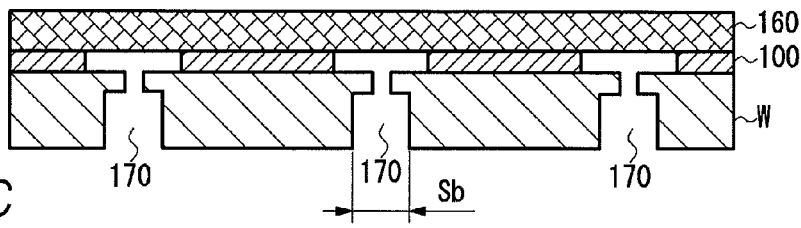

Subsequently, a tape for dicing of a UV-curable type is affixed (S108). As illustrated in FIG. 3A, a tape 160 for dicing with an adhesive layer is affixed on the light emitting element side. Subsequently, half dicing is performed along the microgroove 140 by the dicing blade from the back side of the substrate (S110). For positioning of the dicing blade, a method of disposing an infrared camera above the back side of the substrate and indirectly sensing the microgroove 140 by transmitting the substrate, a method of disposing a camera above the front side of the substrate and directly sensing a position of the microgroove 140, or other known methods can be used. By the positioning, as illustrated in FIG. 3B, half dicing is performed by the dicing blade, and grooves 170 are formed on the back side of the semiconductor substrate. The groove 170 has a depth which reaches the microgroove 140 that is formed on the front side of the semiconductor substrate. Here, the microgroove 140 is formed with a width narrower than the groove 170 which is formed by the dicing blade on the back side, but this is due to the fact that, if the microgroove 140 is formed with a width narrower than the groove 170 on the back side, the number of semiconductor pieces which can be acquired from one wafer is increased, compared to a case in which the semiconductor substrate is cut only by the dicing blade. As illustrated in FIG. 2C, if the microgrooves with a width of approximately several μm to approximately a dozen μm are formed from the front side of the semiconductor substrate toward the back side, it is not necessary to form the grooves on the back side by using the dicing blade in the first place, but it is not easy to form the microgroove with that depth. Thus, as illustrated in FIG. 3B, half dicing that is formed from the back side by the dicing blade is combined.

Figure 3C:
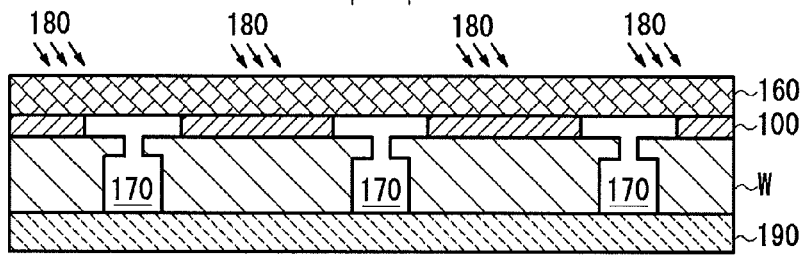

Subsequently, ultraviolet light (UV) is applied to the tape for dicing, and a tape for expanding is also affixed (S112). As illustrated in FIG. 3C, ultraviolet light 180 is applied to the tape 160 for dicing, and the adhesive layer is cured. Thereafter, a tape 190 for expanding is affixed to the back side of the semiconductor substrate.

Figure 3D:
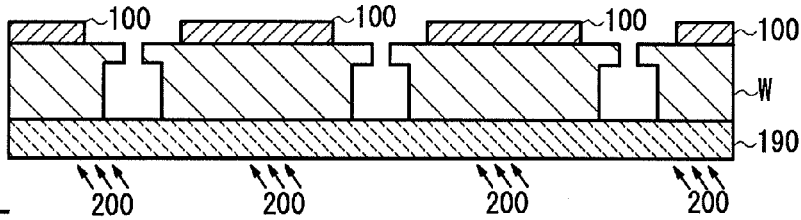

Subsequently, the tape for dicing is removed, and ultraviolet light is applied to the tape for expanding (S114). As illustrated in FIG. 3D, the tape 160 for dicing is removed from the front side of the semiconductor substrate. In addition, ultraviolet light 200 is applied to the tape 190 for expanding on the back side of the substrate, and the adhesive layer is cured. The tape 190 for expanding is elastic to a base member, the tape extends in such a manner that the diced semiconductor pieces are easily picked up after dicing, and thereby the interval between the light emitting diodes is expanded.

Figure 3E:
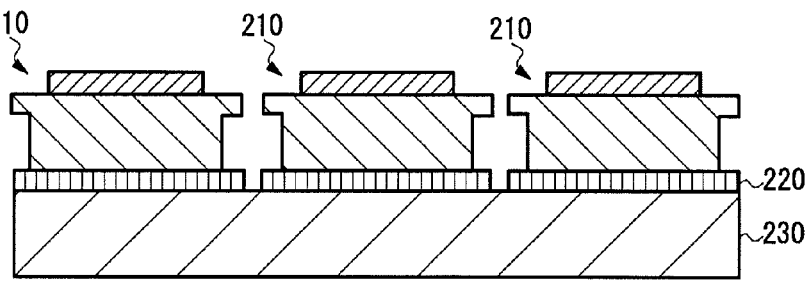

Subsequently, picking up of the diced semiconductor pieces and die mounting are performed (S116). As illustrated in FIG. 3E, the semiconductor piece 210 which are picked up from the tape 190 for expanding is mounted on a circuit board 230 through a fixing member 220 such as a conductive paste such as adhesive or solder.

Figure 5:
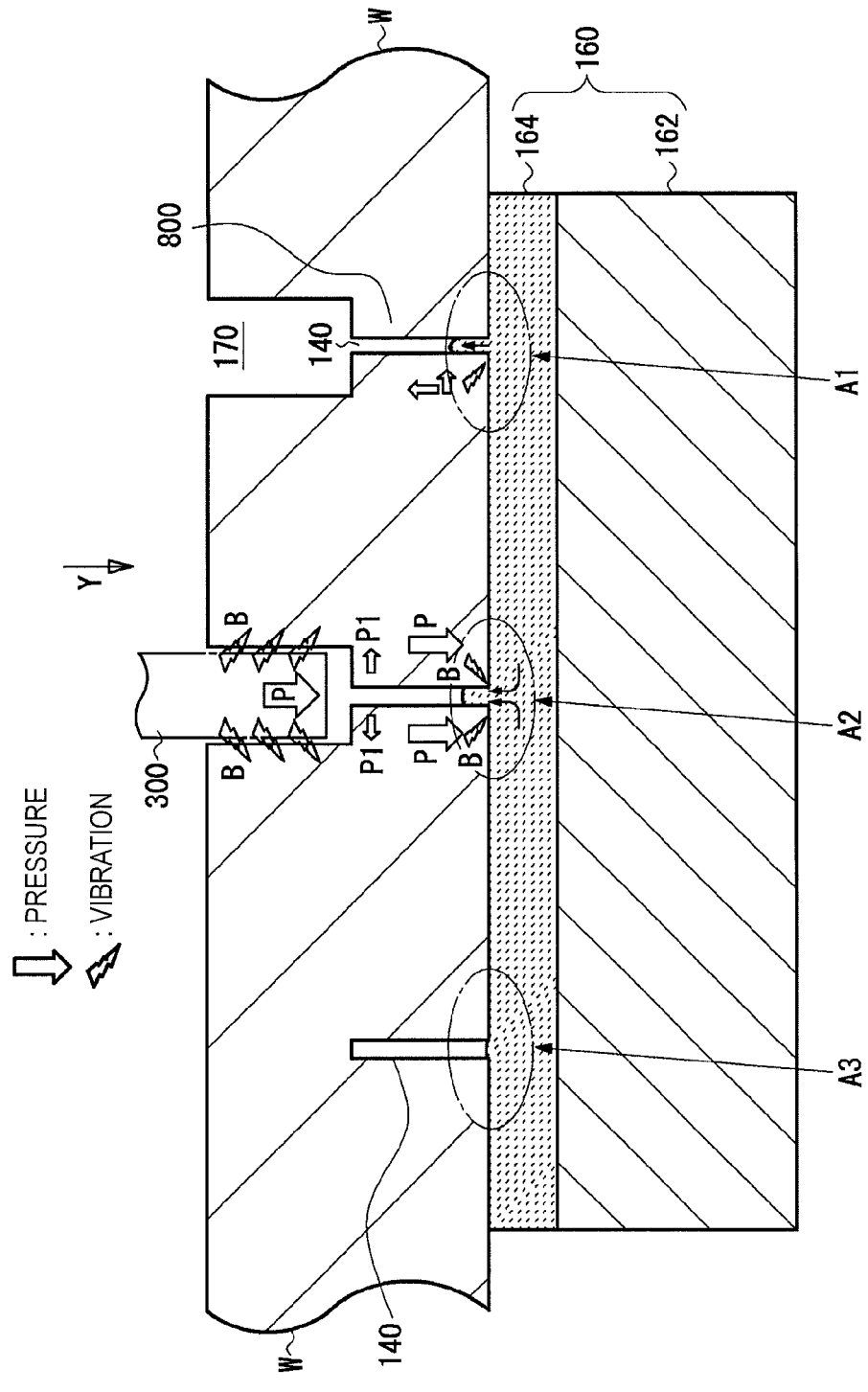
FIG. 5 is a sectional view illustrating in detail half dicing performed by a dicing blade.

Subsequently, half dicing that is performed the dicing blade will be described in detail. FIG. 5 illustrates a state in which an enlarged section view is turned upside down when half dicing is performed by the dicing blade as illustrated in FIG. 3B. FIGS. 3A to 3E emphatically illustrate the light emitting element 100 that is formed on the front side of the substrate. However, FIG. 5 does not clearly illustrate a light emitting element 100 on the front side of the substrate, but the light emitting element 100 is formed on the front side of the substrate in the same manner as in FIGS. 3A to 3E.

As illustrated in FIG. 5, the dicing blade 300 forms the groove 170 in the semiconductor substrate W by cutting the semiconductor substrate W along the microgroove 140 from the back side, while rotating. The dicing blade 300 is, for example, a disc-shaped cutting member. Here, an example in which a tip portion thereof has a constant thickness is illustrated, but the dicing blade may have the tip portion is tapered. The groove 170 (kerf width) that is formed by the dicing blade 300 has approximately the same width as the thickness of the dicing blade 300, and the groove 170 is worked to a depth communicating with the microgroove 140. The dicing blade 300 is positioned in a direction parallel to the back side of the semiconductor substrate W, outside the semiconductor substrate W. Furthermore, as the dicing blade 300 moves by a predetermined amount in a direction Y perpendicular to the back side of the semiconductor substrate W, a step portion 800 that is formed by a step which is formed in a coupling portion of the groove 170 and the microgroove 140 is positioned in a thickness direction of the semiconductor substrate W so as to have a predetermined thickness T in the Y direction. Then, after the dicing blade 300 is positioned outside the semiconductor substrate W, at least one of the dicing blade 300 and the semiconductor substrate W moves in a direction parallel to the back side of the semiconductor substrate W, while the dicing blade 300 rotates, and thereby the groove 170 is formed in the semiconductor substrate W. The step portion 800 is a portion between a step that is formed in the coupling portion of the groove 170 and the microgroove 140, and the front surface of the semiconductor substrate W, but, in other words, is a portion of s step shape which is formed by a difference between a width of the groove 170 and a width of the microgroove 140.

When the half dicing performed by the dicing blade 300 is performed, the tape 160 for dicing is affixed to the front side of the substrate. The tape 160 for dicing includes a tape base member 162 and an adhesive layer 164 stacked on the tape base member. The adhesive layer 164 is configured by an ultraviolet-curable resin, has a constant viscosity or viscous properties before ultraviolet light is applied, and has a property that is cured at the time when ultraviolet light is applied and thereby loses adhesive properties. For this reason, when the tape 160 for dicing is affixed, the adhesive layer 164 adheres to the front side of the substrate including the microgroove 140, and retains the substrate in such a manner that the diced semiconductor piece is not separated after the dicing.

In a cutting line A2 of FIG. 5, while the semiconductor substrate W is cut, vibration B and cutting pressure P are applied to the semiconductor substrate W through the inner wall of the groove 170 by rotation of the dicing blade 300 or a relative movement between the dicing blade 300 and the semiconductor substrate W. If the semiconductor substrate W is pressed in the Y direction by the cutting pressure P, the adhesive layer 164 with viscosity flows into the microgroove 140. In addition, as the vibration B is transferred to the vicinity of the microgroove 140, the flow of the adhesive layer 164 is expedited. Furthermore, during the cutting performed by the dicing blade 300, cutting water (jet stream) which is mingled with cutting powder is supplied to the groove 170, pressure P1 is applied in a direction in which the microgroove 140 is expanded by the cutting water, and thus entry of the adhesive layer 164 is further expedited. As a result, if the microgroove does not have a forward tapered shape according to the present example which will be described later, there is a case in which the adhesive layer 164 enters into the microgroove 140 with a width of approximately 5 μm at an entry depth of approximately 10 μm, for example. Thus, in the present example, even in a method of fabricating the semiconductor piece by narrowing the groove width on the front side more than the groove width on the back side due to a reason such as an increase of the acquired number of the semiconductor pieces, if the groove on the back side is formed by a rotating cutting member, the acquired number of the semiconductor pieces is slightly reduced, and thus the microgroove of a forward tapered shape is formed as will be described later.

In the cutting line A1 in which dicing is completed, pressure is applied to the microgroove 140 in such a manner that the microgroove 140 is narrowed in a width direction, during the cutting of the cutting line A2 adjacent to the cutting line A1, and thus it is considered that the adhesive layer 164 enters into the microgroove 140 is easily entered further into the microgroove 140. In a cutting line A3 on an opposite side before cutting, the adhesive layer 164 is just affixed, and thus it is considered that an amount of the adhesive layer 164 which enters into the microgroove 140 is relatively reduced.

Figure 6:
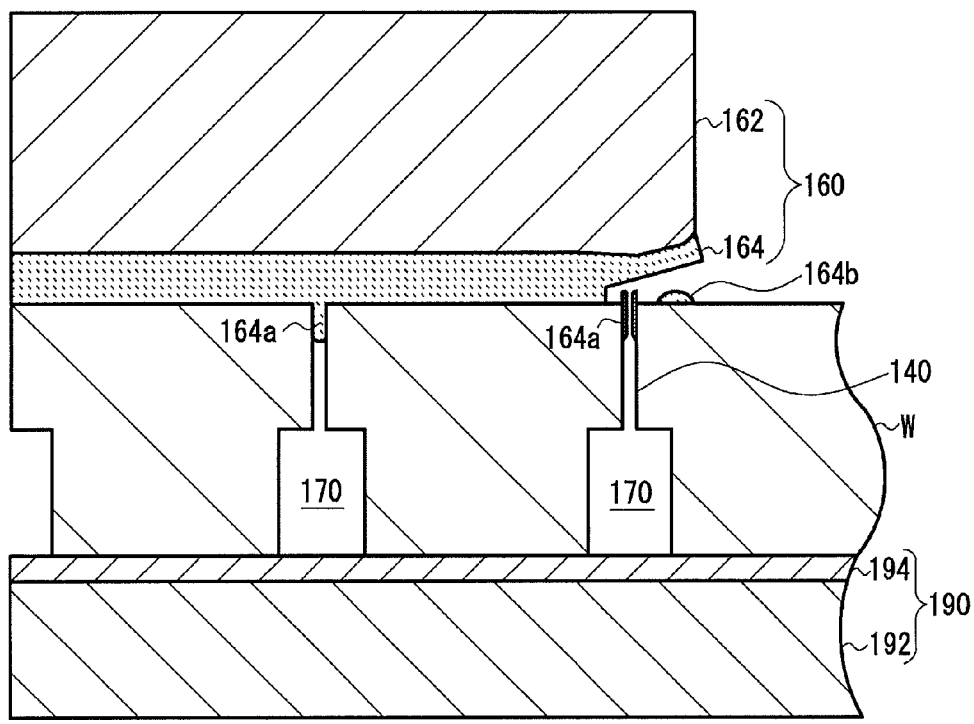
FIG. 6 is a sectional view illustrating a remained adhesive layer at the time when a tape for dicing is removed from a front side of the substrate.

If the half dicing performed by the dicing blade 300 is completed, the tape 190 for expanding is affixed to the back side of the substrate, and subsequently, the ultraviolet 180 is applied to the tape 160 for dicing. The adhesive layer 164 to which ultraviolet light is applied is cured, and adhesive force thereof is lost (FIG. 3C). Subsequently, the tape for dicing is removed from the front side of the substrate. FIG. 6 is a sectional view illustrating remaining of the adhesive layer when the tape for dicing is removed. The tape 190 for expanding which is affixed to the back side of the substrate includes the tape base member 192 and the adhesive layer 194 stacked on the tape base member, the cut semiconductor piece is retained by the adhesive layer 194.

When the tape 160 for dicing is removed from the front side of the substrate, an adhesive layer 164a that enters into the microgroove 140 enters up to a deep position, and thus there is a case in which a part thereof is not sufficiently irradiated with ultraviolet light and is uncured. Since the uncured adhesive layer 164 has viscosity, when the adhesive layer 164 is removed from the front side of the substrate, the uncured adhesive layer 164a is cut, and the adhesive layer 164a remains in the microgroove 140, or can remain in a state of being reaffixed to the front side of the substrate. In addition, even in a state of being cured, the adhesive layer 164a deeply enters into a narrow microgroove, and thus can remain in a torn manner by stress during removing. If a remained adhesive layer 164b is reaffixed to the front side of the light emitting element, a light amount of the light emitting element is reduced, the light emitting element becomes defective, and yield decreases. In addition, even in a semiconductor chip other than the light emitting element, the adhesive layer 164b remains, and thus other adverse effects such as a failure that is determined by an appearance inspection of the chip occur. For this reason, it is not preferable that, when the tape for dicing is removed, the adhesive layers 164a and 164b remain on the front side of the substrate. In the present example, as the shape of the microgroove that is formed on the front side of the substrate is changed to a forward tapered shape which will be described later, it is possible to prevent the adhesive layer from remaining in the microgroove, on the front surface of the substrate, or the like at the time when the tape for dicing is removed.

There are many cases in which, if the plural light emitting elements 100 are formed in a mesa shape, the light emitting element 100 forms a convex portion, a concave portion is formed between the light emitting elements 100 and another light emitting elements 100, and the microgroove 140 is mostly formed in the concave portion. In the aforementioned configuration, the adhesive layer 164 is affixed to not only the convex portion but also an entrance portion of the microgroove 140, and thus, a configuration in which cutting water which is mingled with cutting powder does not invade the front side of the substrate is considered. However, in order to follow the adhesive layer 164 at the entrance portion of the microgroove 140, a tape for dicing having the adhesive layer 164 with a sufficient thickness is required, and thus, and thereby the adhesive layer 164 easily and more deeply enters into the microgroove 140. Thus, in conditions in which the adhesive layer 164 easily and deeply enters into the microgroove 140, the microgroove of a forward tapered shape according to the present example which will be described later is applied, and thus a greater effect can be obtained with respect to the remaining of the adhesive layer 164.

In addition, it is considered that, when the microgroove perpendicular to the front side of the semiconductor substrate is formed, a case in which the adhesive layer 164 enters more deeply than a distance of the width of the microgroove, that is, a case in which a shape of the adhesive layer 164a, which is located at the microgroove, of the adhesive layer 164 is perpendicularly long, the adhesive layer 164 is easily torn by stress applied to a root portion of the adhesive layer 164a in the microgroove, and easily remains, compared to a case in which the shape of 164a is not perpendicularly long, when the adhesive layer 164 is removed. Thus, in conditions in which the width of the microgroove, the thickness of the adhesive layer 164, or the like is fabricated such that the shape of the adhesive layer 164a in the microgroove is perpendicularly long in a case in which the forward tapered shape according to the present example is not applied, the microgroove of the forward tapered shape according to the present example which will be described later is applied, and thus a greater effect can be obtained with respect to the remaining of the adhesive layer 164.

Figure 7A:
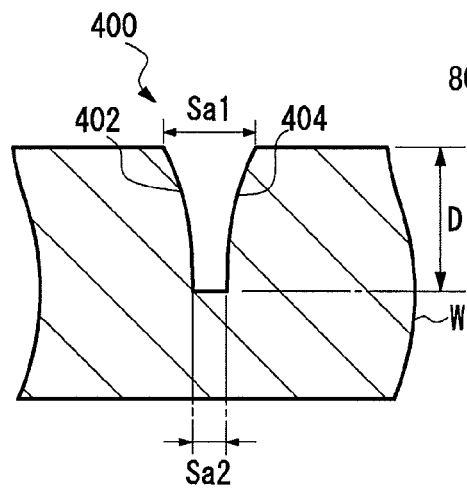
FIGS. 7A to 7D are microgrooves according to the example of the present invention.

Subsequently, the shape of the microgroove according to the example of the present invention will be described. FIG. 7A is a sectional view illustrating a shape of a first microgroove according to the present example, and FIG. 7B is a view illustrating ultraviolet light irradiation to the adhesive layer which enters into the microgroove of FIG. 7A.

As illustrated in FIG. 7A, a microgroove 400 according to the present example includes side surfaces 402 and 404 (tilt is referred to as a forward tapered shape) in which an opening width Sa1 is narrowed up to a width Sa2 (Sa1>Sa2) of the bottom portion of a depth D from the opening width Sa1 of the front surface of the substrate, and which face each other in a tilted manner. In other words, the microgroove 400 has a shape in which the width is gradually narrowed from the opening width Sa1 of the front surface of the semiconductor substrate W to the depth D. In addition, the side surfaces 402 and 404 are not a straight line, have a shape in which a lower portion side of the groove extends downwardly at a steep angle rather than an upper portion side of the groove. The shape of the groove is formed by switching etching conditions during the formation of the groove (detailed description will be made later). The opening width Sa1 is, for example, approximately several μm to approximately a dozen μm. In a case in which the groove 170 is formed from the back side more deeply than the depth in which a circuit such as a light emitting element is formed, the depth D is formed such that a step portion 800 which is formed by a width difference between the groove 170 and the microgroove 400 is not damaged. If the microgroove 400 remains, when the groove 170 is formed from the back side of the substrate, the step portion 800 can be broken due to the stress occurring by the dicing blade 300, and thus a depth which is not damaged is required. Meanwhile, since strength of the semiconductor substrate becomes weaker by the deep groove, a case in which the microgroove 400 is too deep becomes difficult, compared to a case in which handling of the semiconductor substrate W is shallow in a process after the microgroove 140 is formed. Thus, it is preferable that a deep formation is not made more than necessary. In addition, it is preferable that the microgroove 400 is formed by anisotropic dry etching, tilting angles of the side surfaces 402 and 404 can be appropriately selected by changing a shape of photoresist, etching conditions, or the like. In the shape of FIG. 7A, a portion (angle portion) in which an angle of the side surface of the groove abruptly changes does not exist at a boundary portion between a first groove portion and a second groove portion, and thus a boundary between the first groove portion on an upper portion side and the second groove portion on a lower portion side is not clear. However, FIG. 7A is an example of a groove (microgroove) on the front side in which a width thereof is not greater than the width of the lowest portion of the first groove portion and which includes the second groove portion downwardly extending at a steeper angle than the angle of the first groove portion, in the first groove portion in which a width is gradually narrowed from the front side of the substrate toward the back side, and a groove portion which is formed to communicate with a lowermost portion of the first groove portion, because the angles of the side surfaces on the upper portion side and the lower portion side of the microgroove 400 are different from each other.

Figure 7B:
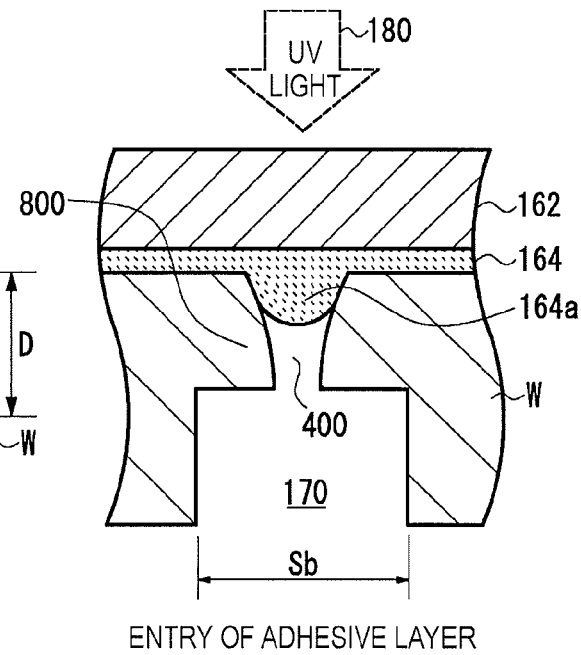

As illustrated in FIG. 7B, the microgroove 170 with a kerf width Sb that is formed by cutting of the dicing blade 300 is formed, and the groove 170 is connected to the microgroove 400. The width (kerf width Sb) of the groove 170 is, for example, approximately 20 μm to approximately 60 μm. A part of the adhesive layer 164 enters into the microgroove 400 of a forward tapered shape by the stress such as pressure from the dicing blade 300 or vibration, and after the tape for expanding is affixed, the tape 160 for dicing is irradiated with the ultraviolet 180 from the front side of the substrate. At this time, since the microgroove 400 is worked in a forward tapered shape, the ultraviolet 180 is not shielded by the semiconductor substrate W, is sufficiently applied to the adhesive layer 164a in the microgroove 400, and thus the adhesive layer 164a in the microgroove 400 is easily cured. As a result, when the tape 160 for dicing is removed from the front side of the substrate, the adhesive layer 164a in the microgroove 400 loses more viscosity, compared to a perpendicular shape of the microgroove 400 even if the opening widths of the microgroove 400 are the same as each other, is easily separated from the front side of the substrate and the microgroove 400, and reaffixing of the adhesive layer to the front side of the substrate is suppressed. Furthermore, since the forward tapered shape of the microgroove 400 has a tilted groove shape, the adhesive layer easily exit and is expedited to withdraw, compared to a case of a perpendicular microgroove, even if the adhesive layer 164a that is pressed to enter into the microgroove 400 is not cured.

Figure 7C:
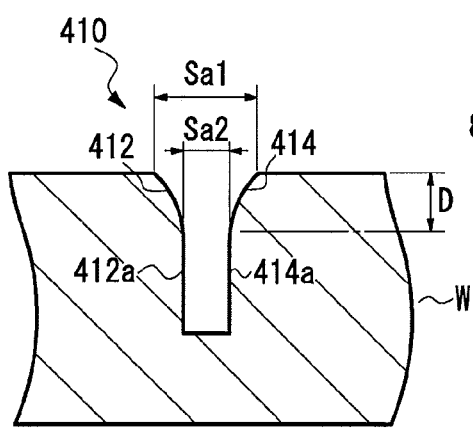

FIG. 7C is a section diagram illustrating a shape of a second microgroove according to the present example. A second microgroove 410 includes groove portions of side surfaces 412 and 414 which face each other in a tilted manner in a forward direction from an opening width Sa1 of the front surface of the substrate to a width Sa2 in an intermediate portion of a depth D, and groove portions of side surfaces 412a and 414a which are approximately perpendicular from the width Sa2 to a bottom portion and face each other. That is, the second microgroove 410 includes a first groove portion whose width is gradually narrowed from the front side of the substrate toward the back side, and a second groove portion in which, in the groove portion that is formed to communicate with the lower part of the first groove portion, a width thereof is not greater than that of the lowermost portion of the first groove portion, and which downwardly extends at a steeper angle than that of the first groove portion. Then, the shape is formed as etching conditions are switched during formation of the groove. In the same manner as in FIG. 7A, the shape of FIG. 7C is a shape in which a portion (angle portion) in which an angle of the side surface of the groove abruptly changes at a boundary portion between the first groove portion and the second groove portion does not exist. It is preferable that the depth D of the groove portion which is tilted by the side surfaces 412 and 414 is deeper than a width into which the adhesive layer 164 enters, at a time when the tape 160 for dicing is affixed. Since a depth of the groove portion deeper than the depth D is narrower than the groove width of the a forward tapered shape, the vibration of the tape for dicing, or a ratio of variation of the groove width due to stress increases to be greater than the groove width of the forward tapered shape. Thus, in a case in which the adhesive layer 164 previously enters into the groove portion deeper than the depth D at the time when the tape for dicing 160 is affixed, the adhesive layer 164 enters into a deeper portion of the groove by the vibration or stress of the dicing blade. Thus, it is preferable that the depth D is deeper than a depth into which the adhesive layer 164 enters, in a state in which the tape 160 for dicing is affixed.

In addition, it is preferable that the depth D is a depth that is maintained to a state in which the adhesive layer 164 does not enter into a groove portion deeper than the depth D, after a groove is formed on the back side by the dicing blade. Preferably, the depth D is 10 μm or more. This is due to the fact that, if the adhesive layer 164 enters into the groove portion deeper than the depth D, the adhesive layer more easily remains at the time of removing. Other conditions such as the depth of the entire microgroove are the same as those of FIG. 7A. Here, as another embodiment of FIG. 7(C), the second groove portion of the second microgroove 410 may have a shape in which the width of the second groove portion gradually broadens from the depth D toward the bottom of the second microgroove 410 in condition that the depth D is 10 μm or more since the depth into which an adhesive layer enters is within 10 μm.

Here, if the microgroove is deeply formed only by the forward tapered shape as illustrated in FIG. 7A, it is necessary to expand the opening portion Sa1. In addition, if the microgroove 400 is deeply formed only by the forward tapered shape as the opening portion Sa1 is narrowed, a tapered angle becomes a steep angle, and thus the adhesive layer 164 easily remains in the microgroove 400. Meanwhile, in the shape of FIG. 7C, the width of the opening portion Sa1 is maintained to a width in which the adhesive layer may remain in the microgroove, and a microgroove with a desired depth is easily formed. If the microgroove with a desired depth can be formed, in a case in which a groove 170 with a width wider than the width of a microgroove 410 is formed from the back side, it is possible to prevent a step portion from being broken, compared to a case in which the depth of the microgroove is shallow.

In addition, when the microgroove perpendicular to the front side of the semiconductor substrate is formed, a case in which the adhesive layer 164 enters more deeply than a distance of the width of the microgroove, that is, a case in which a shape of the adhesive layer 164a, which is located at the microgroove, of the adhesive layer 164 is perpendicularly long, the adhesive layer 164 easily remains by stress applied to a root portion of the adhesive layer 164a in the microgroove, compared to a case in which the shape of 164a is not perpendicularly long, when the adhesive layer 164 is removed. Thus, it is preferable that, if it is assumed that a perpendicular microgroove is formed, an entry portion of the microgroove has the forward tapered shape, such that the shape of the adhesive layer 164a that enters into the microgroove is perpendicularly long, in fabrication conditions such as a width of the microgroove or a thickness of the adhesive layer 164, as illustrated in FIG. 7C. That is, in a case in which a groove width of the groove portion located in a lower part than a groove portion of the forward tapered shape is a width narrower than the depth into which the adhesive layer enters in a case in which it is assumed that the entire microgroove 410 is formed at the groove width, if an entry portion of the groove has a forward tapered shape, a greater effect can be obtained with respect to the remaining of the adhesive layer 164.

Figure 7D:
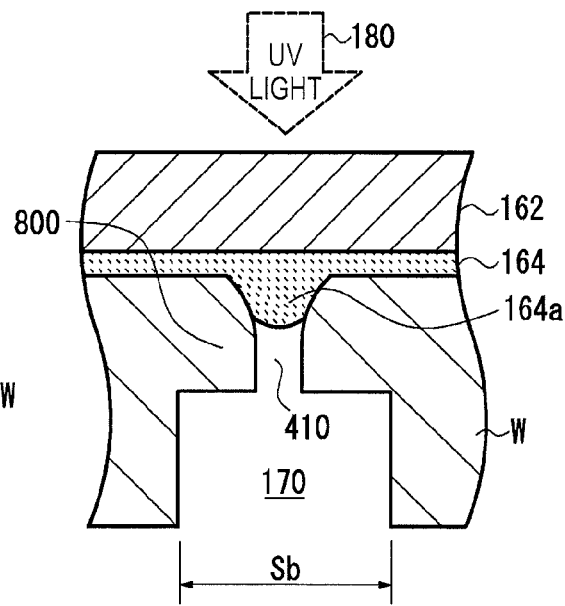

If the groove 170 of the kerf width Sb is formed by cutting of the dicing blade 300 with respect to the microgroove of FIG. 7C, the groove 170 is connected to the microgroove 410, as illustrated in FIG. 7D. In the same manner as in the time of FIG. 7B, a part 164a of the adhesive layer 164 enters into the microgroove 410, but if the depth D of the groove portion (side surfaces 412 and 414) of a forward tapered shape of the microgroove 410 is deeply formed more than the depth into which the adhesive layer 164a enters, the adhesive layer 164a in the microgroove 410 is sufficiently irradiated by ultraviolet light, and is easily cured. For this reason, when the tape for dicing is removed, it is possible to prevent the adhesive layer from remaining in the microgroove 410 or on the front side of the substrate. In addition, since the side surface of the microgroove 410 is tilted, the adhesive layer easily exits and is expedited to withdraw, even in a case in which the adhesive layer 164a that is pressed to enter into the microgroove 410 is not cured.

Figure 9A:
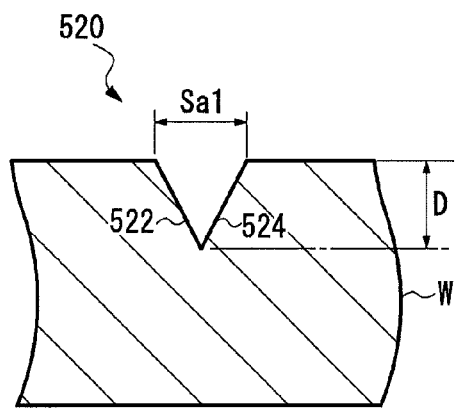
FIGS. 9A to 9C are microgrooves according to another comparative example.

In this way, according to the present example, since the microgrooves 400 and 410 are configured to include a groove portion of a forward tapered shape in which an opening width of at least the front side of the substrate is narrowed toward a bottom portion, even if the adhesive layer of the tape for dicing enters into the microgroove, viscosity thereof is lost by applying ultraviolet light to the entire adhesive layer in the microgroove and curing the adhesive layer, compared to a case in which the forward tapered shape is not formed. Furthermore, since the forward tapered shape is formed, when the tape for dicing is removed, cutting of the adhesive layer is prevented, compared to a case in which the forward tapered shape is not formed, and removal from the microgroove and the front side of the substrate is easily made by an integral formation. In addition, in the same manner as a shape of FIG. 9A which will be described later, since not only the side surfaces of the microgroove are straight lines, but also the side surfaces on the lower portion side have a steeper angle than the side surfaces on the upper portion side, a deeper groove than the shape of FIG. 9A is formed, even in conditions in which widths of the opening portions of the microgrooves are the same as each other. If a deeper groove can be formed, when the groove 170 is formed on the back side, it is difficult for a step portion 800 to be broken due to stress occurring by the dicing blade. Thus, when the shape of FIG. 9A is compared to the shapes of FIG. 7A or 7C, the shape of FIG. 7A or 7C easily obtains the effects of prevention of the remaining of the adhesive layer and prevention of breakage of the step portion.

In addition, all of FIGS. 7A to 7D illustrate a shape in which the opening width Sa1 on the front surface of the substrate is narrower than the width of the groove 170, but, this is because, if the opening width Sa1 of the front surface of the substrate is configured to be narrower than the width of the groove 170, the acquired number of semiconductor pieces can be increased, compared to a method of dicing as the width of the groove 170 is. Here, in general, in order to increase the acquired number of semiconductor pieces, the groove on the front side that is formed by anisotropic etching by which a groove of a shape whose width is narrower and perpendicular is easily formed, is better than the groove on the front side that is formed by isotropic etching or a dicing blade. However, if the groove shape whose width s narrow and is perpendicular is simply formed by employing anisotropic etching, that is not preferred from a viewpoint of remaining of an adhesive layer. Meanwhile, if it is noted to the remaining of the adhesive layer, the opening of the microgroove that is not a perpendicular shape and is formed by isotropic etching or the like, is better than the groove on the front side that is formed by anisotropic dry etching by which the groove has a shape whose width is narrow and is perpendicular, but a groove whose width is narrow and deep is not formed by isotropic etching. Hence, in the present example, as the microgroove of the shape illustrated in FIGS. 7A to 7D is formed even by anisotropic dry etching, it is possible to increase the acquired number of semiconductor pieces and to prevent the adhesive layer from remaining.

Figure 8A:
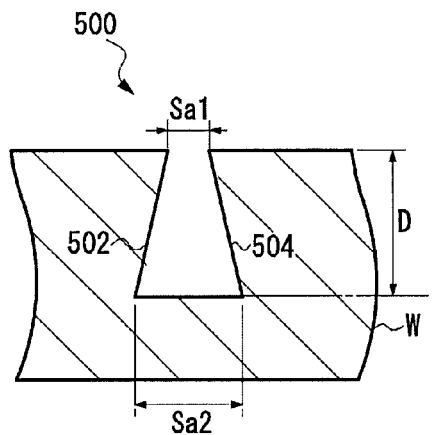
FIGS. 8A to 8D are microgrooves according to a comparative example.
Figure 8B:
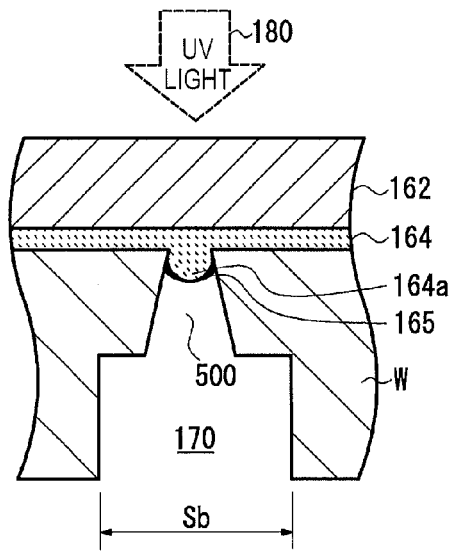

FIGS. 8A and 8B are comparative examples at the time when the microgroove is worked in a reverse tapered shape. As illustrated in FIG. 8A, a microgroove 500 has side surfaces 502 and 504 in which a width Sa2 of the bottom portion is greater than an opening width Sa1, and which face each other and are tilted. The microgroove 500 is worked in a so-called reverse tapered shape. In this way, the shape in which a width on the bottom portion side is wider is formed by setting a balance between a flow amount of gas (Cl2 or the like) for etching included in etching gas, and a flow amount of gas (C4F8 or the like) for forming a protective film which protects a side wall, so as to work in a reverse tapered shape, in a case of using isotropic etching or even using anisotropic dry etching. As illustrated in FIG. 8B, when a part 164a of the adhesive layer 164 enter into the microgroove 500 of a reverse tapered shape, an opening of the opening width Sa1 becomes narrower, and thus a part of the ultraviolet light 180 is easily shielded by the semiconductor substrate W, ultraviolet light is not sufficiently applied to a peripheral portion 165 (filling portion in the figure) of the adhesive layer 164a, and lots of uncured adhesive layer 165 easily remain. For this reason, when the tape for dicing is removed, the adhesive layer 165 with viscosity is easily cut and easily remains within the microgroove, or is reaffixed to the front of the substrate of the like, compared to a case of a forward tapered shape. Furthermore, since having a reverse tapered shape, the adhesive layer 164 which is pressed to enter into the microgroove 500 and is cured hardly exits in a smooth manner.

Figure 8C:
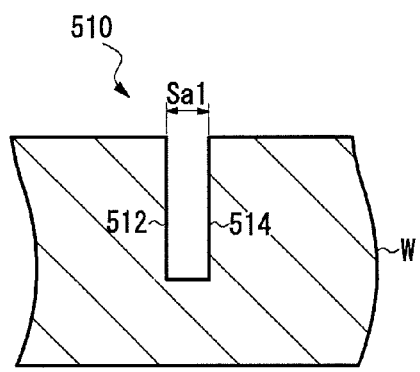
Figure 8D:
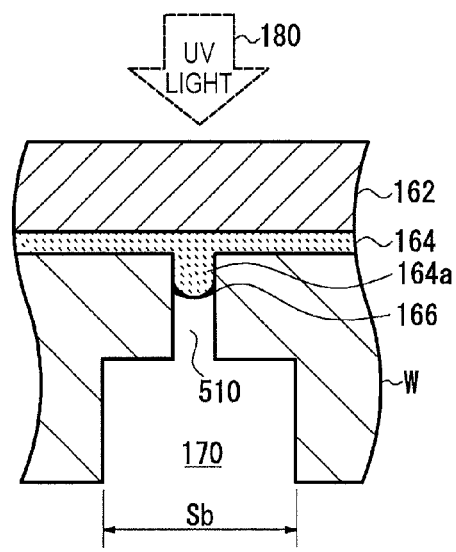

FIGS. 8C and 8D are comparative examples at the time when the microgroove is worked in a perpendicular shape. As illustrated in FIG. 8C, a microgroove 510 includes side surfaces 512 and 514 which are perpendicular to the opening width Sa1 of the front surface of the substrate and face each other, and is worked to a groove of a so-called perpendicular shape. The shape is formed by employing a general anisotropic dry etching. As illustrated in FIG. 8D, since the adhesive layer 164a which enters into the microgroove 510 of a perpendicular shape deeply enters into the interior of the width Sa1 of the microgroove, the entire adhesive layer 164a is not sufficiently irradiated by the ultraviolet light 180, and an adhesive layer 166 of a part of a peripheral portion thereof is easily uncured, compared to a case of a forward tapered shape. The uncured adhesive layer 166 is smaller than the adhesive layer 165 of a reverse tapered shape of FIG. 8A, but the adhesive layer 166 can remain on the microgroove 510 or can be reaffixed to the front surface of the substrate, when the tape for dicing is removed.

FIG. 9A is a comparative example at the time when a microgroove 520 is worked in a forward tapered shape having only side surfaces 522 and 524 of a straight line shape. The shape is formed by setting a balance between a flow amount of gas (Cl2 or the like) for etching included in etching gas, and a flow amount of gas (C4F8 or the like) for forming a protective film which protects a side wall, so as to work in a forward tapered shape, for example, anisotropic dry etching. As illustrated in FIG. 9A, an adhesive layer 164a which enters into the microgroove 520 of a forward tapered shape becomes a state in which the entire adhesive layer 164a is easily irradiated with the ultraviolet light 180, compared to a shape of FIG. 8A or 8C. Thus, uncured adhesive layer hardly occurs after the ultraviolet light 180 is applied, and when the tape for dicing is removed, the adhesive layer hardly remains in the microgroove 520 or on the front surface of the substrate, or is hardly reaffixed. However, in the shape of FIG. 9A, the side surfaces 522 and 524 of the microgroove 520 are configured by side surfaces of a straight line shape with a constant angle differently from the shape of FIG. 7A or 7C, a deeper groove than that of FIG. 7A or 7C cannot be formed, if the width Sa1 of an entry portion of the microgroove is compared at the same conditions. In a case in which a shallow groove is formed instead of a deep groove, the step portion 800 is easily broken due to the stress occurring by the dicing blade, when groove 170 is formed in the back side, as described above. Thus, when the shape of FIG. 9A is compared to the shape of FIG. 7A or 7C, the shape of FIG. 7A or 7C easily obtains the effects of prevention of the remaining of the adhesive layer and prevention of breakage of the step portion.

Figure 9B:
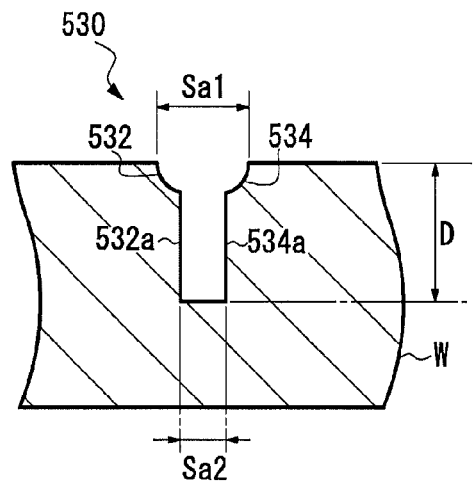

In FIG. 9B, the microgroove 530 includes a first groove portion 532 and 534 whose width is gradually narrowed from the front side of the substrate toward the back side, and second groove portions 532a and 534a which are formed so as to communicate with the lower part of the first groove portion, whose widths are not wider than the width of the lowermost portion of the first groove portion, and which downwardly extend at a steeper angle than that of the first groove portion. For example, the shape can be realized by forming a groove portion on an upper portion side corresponding to the first groove portion through isotropic etching, and by forming a groove portion on a lower portion side corresponding to the second groove portion through anisotropic dry etching. In FIG. 9B, an entry portion of the microgroove 530 has a forward tapered shape in the same manner as in FIG. 9A, and thus the adhesive layer hardly remain in the microgroove 530 or on the front surface of the substrate, compared to the shape of FIG. 8A or 8C. In addition, since, even though the width Sa1 of the entry portion of the microgroove 530 is the same as that of FIG. 9A, a deeper groove can be formed, compared to the shape of FIG. 9A, the step portion 800 is prevented from being broken. However, in the shape of FIG. 9B, the microgroove 530 has an on its side surface. In other words, there are portions (angle portions) in which the angles between the side surfaces 532 and 532a, and between the side surfaces 534 and 534a of the groove abruptly change between the first and second groove portions, and thus, if the adhesive layer enters into the second groove portion, the entire adhesive layer is hardly irradiated with the ultraviolet light 180 and uncured adhesive layer easily occurs, compared to the shapes of FIG. 7A or 7C. In addition, as there are portions (angle portions) in which the angles between the side surfaces 532 and 532a, and between the side surfaces 534 and 534a of the groove abruptly change, when the tape 160 for dicing is removed from the front side of the substrate, the adhesive layer 164A which enter up to the second groove portion is hooked to a corner to be torn, and thus remaining of the adhesive layer 164a is expedited. Thus, if the shape of FIG. 9B is compared to the shape of FIG. 7A or 7C, the shape of FIG. 7A or 7C easily obtains the effects of prevention of the remaining of the adhesive layer and prevention of breakage of the step portion.

Figure 9C:
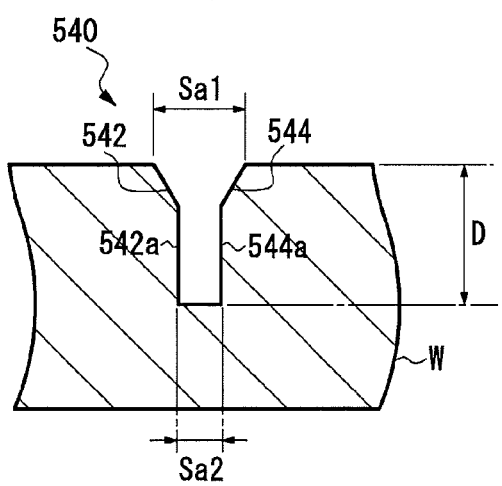

FIG. 9C, the microgroove 540 includes a first groove portion which is configured by side surfaces 542 and 544 whose width is gradually narrowed from the front side of the substrate toward the back side and has s straight line shape, and second groove portions 532a and 534a which are formed so as to communicate with the lower part of the first groove portion, and which are configured by side surfaces 542a and 544a that downwardly extend in an approximately perpendicular shape. For example, the shape can be realized by forming a portion corresponding to the first groove portion using a tip portion only of a dicing blade having the tip portion of an acute angle, and by forming a portion corresponding to the second groove portion using a dicing blade with a shallow thickness. Also in a case of the shape of FIG. 9C, the microgroove 540 has an edge on its side surface. In other words, there are portions (angle portions) in which the angles between the side surfaces 542 and 542a, and between the side surfaces 544 and 544a of the groove abruptly change, in the same manner as in the case of the shape of FIG. 9B described above. Thus, if the shape of FIG. 9C is compared to the shape of FIG. 7A or 7C, the shape of FIG. 7A or 7C easily obtains the effects of prevention of the remaining of the adhesive layer and prevention of breakage of the step portion.

Figure 10A:
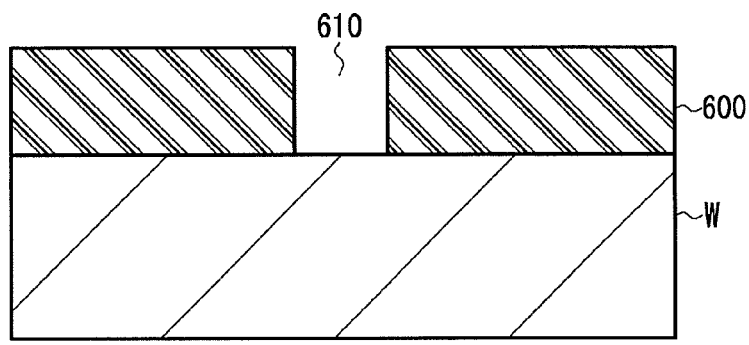
FIGS. 10A to 10D are schematic process sectional views illustrating a fabrication method of a microgroove according to an example of the present invention.

Subsequently, a fabrication method of the microgroove according to the present example will be described. FIGS. 10A to 10D are sectional views illustrating steps of fabrication method of the microgrooves illustrated in FIGS. 7A and C. As illustrated in FIG. 10A, a photoresist 600 is applied to the front side of the semiconductor substrate W (GaAs substrate) in which plural light emitting elements are formed. The photoresist 600 is an i-line resist with viscosity of, for example, 100 cpi, and is formed at a thickness of approximately several μm. An opening 610 is formed in the photoresist 600, using a known step, for example, an i-line stepper or a developing solution of TMAH 2.38%. The opening 610 is formed to expose a cutting area 120 as illustrated in FIG. 2A.

Figure 10B:
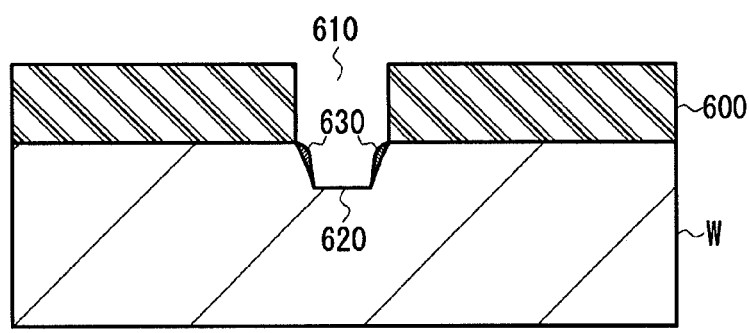

Subsequently, as illustrated in FIG. 10B, anisotropic etching is performed to the semiconductor substrate W by using a resist pattern 600 in which the opening 610 is formed as a mask for etching. As an example, an inductively coupled plasma (ICP) is used as a reactive ion etching (RIE) device. By adding CF-based gas as etching gas, a protective film 630 is formed on a side wall of a groove 620 at the same time as etching. Radical and ion are produced by plasma of reactive gas, but side wall of the groove 620 are attacked only by radical, a bottom portion is attacked by both radical and ion thereby being easily etched, and anisotropic etching is achieved. Here, etching conditions, such as outputs of an etching device, a flow amount of gas, or time are adjusted, and etching is performed under conditions by which a groove of a forward tapered shape is formed. For example, as a flow amount of gas (Cl2 or the like) for etching included in etching gas increases, or a flow amount of CF-based gas (C4F8 or the like) that is gas for forming a side wall protective film decreases, the protective film 630 which is formed on the side wall of the groove is thinned, and thus an angle of the side wall of the groove becomes steep with respect to a depth direction (that is, becomes an approximately perpendicular angle). In contrast to this, as the flow amount of gas (Cl2 or the like) for etching included in etching gas decreases, or the flow amount of CF-based gas (C4F8 or the like) that is gas for forming a side wall protective film increases, the protective film 630 which is formed on the side wall of the groove becomes thick, and thus an angle of the side wall of the groove becomes gentle with respect to a depth direction. For example, as etching conditions, power of inductively coupled plasma (ICP) is 500 W, bias power is 50 W, and pressure is 3 Pa, and as etching gas, Cl2 is 150 sccm, BCl3 is 50 sccm, C4F8 is 50 sccm, the temperature of the substrate is 20° C., and etching time is 20 minutes.

Figure 10C:
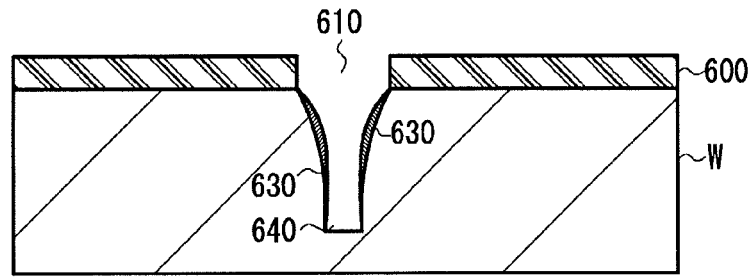

Subsequently, as illustrated in FIG. 10C, etching conditions are switched in such a manner that the angle becomes a steeper angle than that of the forward taper formed in FIG. 10B. For example, as the flow amount of gas (Cl2 or the like) for etching included in etching gas increases, or the flow amount of CF-based gas (C4F8 or the like) that is gas for forming a side wall protective film decreases, a groove portion 640 with a steeper angle than that of the side wall of the groove 620 formed in FIG. 10B is formed. For example, as etching conditions, power of inductively coupled plasma (ICP) is 500 W, bias power is 50 W, and pressure is 3 Pa, and as etching gas, Cl2 is 200 sccm, BCl3 is 50 sccm, C4F8 is 35 sccm, the temperature of the substrate is 20° C., and etching time is 20 minutes. If the microgroove is formed, the thickness of the side wall protective film 630 on the bottom portion side of the groove tends to be thinner than that on the upper portion side, and thus, as etching strength is strengthened on the way, the side wall protective film 630 that is affixed to the bottom portion side of the groove previously formed is cut and the side wall is easily exposed. Accordingly, the groove width on the bottom portion side of the groove previously formed is slightly gently widened and the groove downwardly extends. Meanwhile, since a thick side wall protective film 630 is affixed to the upper portion side of the groove previously formed, and, if etching conditions are extremely strong, the side wall protective film 630 is not cut until the side wall is exposed, the shape of the upper portion side (entry portion) of the groove is retained without changing.

If a flow amount of CF-based gas (C4F8 or the like) for forming a side wall protective film decreases, it is preferable that the flow amount decreases within a range of not being completely stopped. This is due to the fact that, if gas for forming the side wall protective film is stopped, etching strength becomes excessive in a side wall direction, and a groove portion whose width becomes wide toward a lower portion of the microgroove is formed. In a case in which a groove portion whose width becomes wide toward a lower portion of the microgroove in this way, if the adhesive layer 164a enters into the groove portion, the entire adhesive layer 164a is irradiated with the ultraviolet light 180, the adhesive layer 164a easily remains in the same manner as in the case of FIG. 8A. As described above with reference to FIG. 5, if the groove is formed in the back side of the substrate by a rotating cutting member such as a dicing blade with respect to a microgroove, an adhesive layer may enter up to a depth more than expected, such as that the adhesive layer enters into a microgroove with a width of approximately 5 μm, up to a depth of approximately 10 μm. Thus, if there is no special reason for forming a groove portion whose width is widened toward a lower portion of a microgroove, the groove portion may be not formed from a viewpoint of prevention of the remaining of the adhesive layer. In addition, if etching strength becomes excessive in a side wall direction by stopping gas for forming the side wall protective film or the like, the side wall protective film 630 may be cut until the side wall on the upper portion side (entry portion) of the groove is exposed. It is considered that this is because concentration of fresh etching gas on the entry portion side is higher than that of the bottom portion of the microgroove. By doing so, the upper portion side of the groove is etched so as to be widened in a width direction, and a region in which an element is formed may be affected in some cases. Thus, it is preferable that etching strength is switched within a range in which the upper portion side of the groove is not exposed.

Figure 10D:
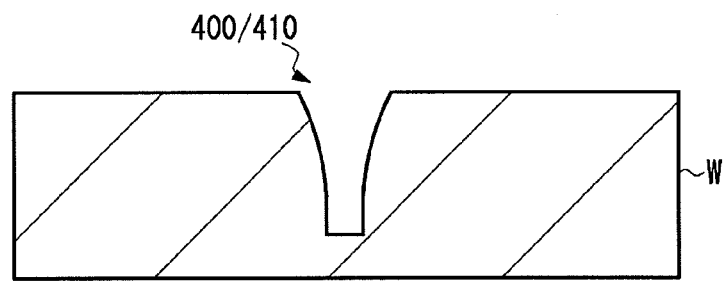

After forming of the microgroove is completed in FIG. 10C, the photoresist 600 is removed by oxygen ashing as illustrated in FIG. 10D. By doing so, the microgrooves 400 and 410 illustrated in FIGS. 7A, and 7C are obtained.

As described above, in the fabrication method of a microgroove according to the present example, forming of the microgroove starts at a first etching strength by which a width of the microgroove is gradually narrowed in a depth direction, during forming of the microgroove, the dry etching conditions are switched to a second etching strength that is stronger than the first etching strength and the width of the entry portion of the groove on the front side downwardly extends without becoming wide, and a microgroove without a portion in which the width of the groove is widened from the front side of the substrate toward the back side is formed. Since etching is performed at the first etching strength by which the width of the microgroove is gradually narrowed in a depth direction, a microgroove of a shape in which remaining of the adhesive layer 164a is prevented compared to the shapes of FIGS. 8A and 8C is formed. In addition, during forming of the microgroove, strength of dry etching is strengthened to a second etching strength by which the width of the entry portion of the microgroove downwardly extends without becoming wide, the microgroove without a portion in which the width is widened toward the lower portion of the groove is formed, and thus the microgroove which is formed in FIG. 9C and has no angle portion is formed. Furthermore, even though the widths of the entry portion of the microgroove are the same as each other, a deeper microgroove is formed, compared to a forward tapered shape having only a side surface of a straight line shape formed in FIG. 9A.

The fabrication method according to the present example described above is just an example, and is not necessarily limited to the fabrication steps illustrated in FIGS. 10A to 10D. For example, the opening 610 of the photoresist 600 which is formed in FIG. 10A has an opening side surface perpendicular to the front surface of the substrate, but since the shape illustrated in FIG. 7A or 7C is easily formed, a shape in which the width of the opening is gradually widened toward the upper portion from the front surface of the substrate may be formed. If a photoresist of the shape is used, etching range is gradually widened from a portion in which a resist is thin to a portion in which the resist is thick, and thereby a forward tapered shape is easily formed. In addition, it is not necessary to perform the switching of etching conditions only once, and if the etching strength gradually increases, the switching may be performed plural times if necessary.

Figure 11A:
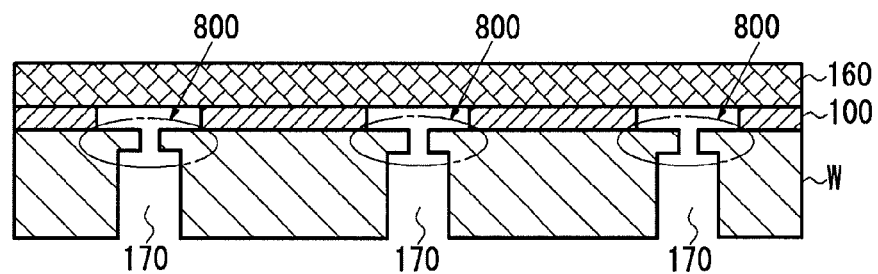
FIG. 11A is a sectional view illustrating a step portion that is formed in a semiconductor chip.
Figure 11B:
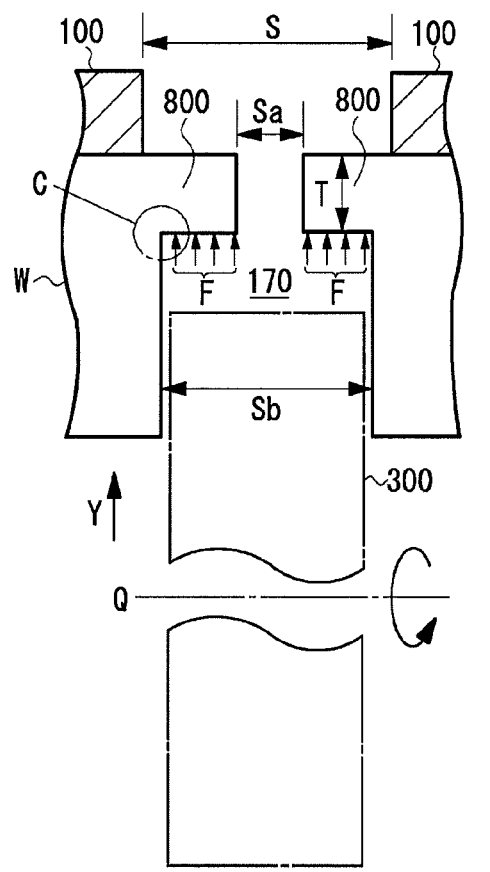
FIG. 11B is a view illustrating load that is applied to the step portion at the time of being cut by a dicing blade.
Figure 11C:
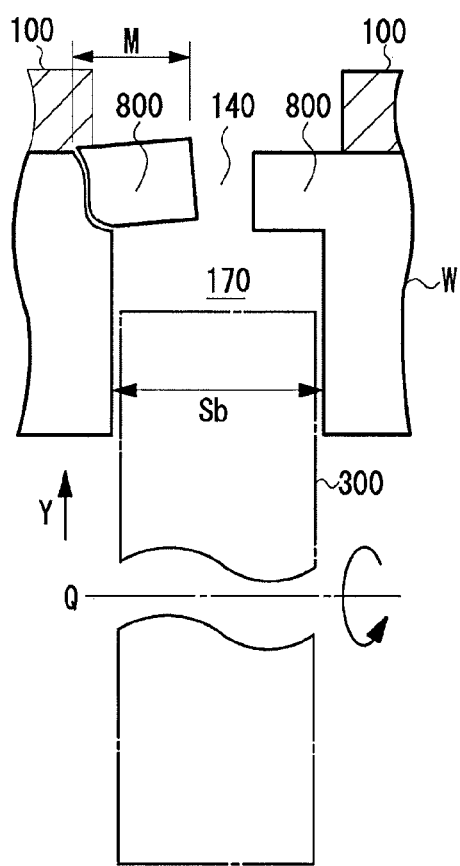
FIG. 11C is a view illustrating breakage of the step portion.

Subsequently, breakage of a step portion that is formed by a difference between a width of a microgroove and a width of a groove on the back side will be described. FIG. 11A is a sectional view at the time when half dicing performed by the dicing blade is made as illustrated in FIG. 3B, FIG. 11B is an enlarged view of the step portion illustrated in FIG. 11A, and FIG. 11C illustrates breakage of the step portion.

As described above, the plural light emitting elements 100 are formed on the front side of the semiconductor substrate W, and each of the light emitting elements 100 is separated by the cutting area 120 that is defined by the scribe line or the like with the interval S. It is assumed that the microgroove 140 (groove of a perpendicular shape illustrated in FIG. 8C) with the width Sa is formed in the cutting area 120 by anisotropic dry etching. While the dicing blade 300 with the kerf width Sb rotates, the back side of the semiconductor substrate W is cut, and the groove 170 with a width that is approximately the same as the kerf width Sb is formed in the semiconductor substrate W. Since the kerf width Sb is greater than the width Sa of the microgroove 140, when the groove 170 is formed, the cantilevered step portion 800 with the thickness T is formed in the cutting area 120 by a difference between the width Sb and the width Sa, in other words, a difference between the positions of the side surfaces of the microgroove 140 and the groove 170. If the center of the dicing blade 300 completely coincides with the center of the microgroove 140, a length extending in a horizontal direction of the step portion 800 becomes (Sb−Sa)/2.

When cutting is performed by the dicing blade 300, a flat surface of the tip portion of the dicing blade 300 presses the semiconductor substrate W in the Y direction, and thereby force F is applied to the step portion 800, and stress is concentrated on a corner portion C of the step portion 800. When the stress to the corner portion C exceeds fracture stress of the wafer, breakage (chipping, cracking, picking, or the like) of the step portion 800 occurs as illustrated in FIG. 11C. Particularly, a compound semiconductor substrate such as a GaAs substrate has a lower strength than a silicon substrate, and thus the step portion 800 is easily broken. If the step portion 800 is broken, margin M has to be ensured for cutting of the step portion 800, this means that the interval S of the cutting area 120 has to be equal to the margin M or has to be greater than the margin, and thereby the acquired number of semiconductor pieces decreases. Thus, it is preferable that the step portion 800 is prevented from being broken.

As factors highly affecting the stress which causes the breakage of the step portion 800, the following three items are mainly considered: First, a shape of the tip portion of the dicing blade, second, the thickness T of the step portion 800, and third, a magnitude of a step of the step portion, that is, an amount of position shift between the microgroove 140 and the groove 170, if the dicing blade 300 with a predetermined thickness is used. As described in the present example, forming of the microgroove starts at a first etching strength by which a width of the microgroove is gradually narrowed in a depth direction, and during forming of the microgroove, the dry etching conditions are switched to a second etching strength that is stronger than the first etching strength and the width of the entry portion of the groove on the front side downwardly extends without becoming wide, and thereby a deeper microgroove is formed, compared to a case in which the microgroove is formed only by the first etching strength. Accordingly, the thickness T of the step portion 800 becomes thick. Thus, even if the shapes or amounts of position shift of the tip portion of the dicing blade are the same as each other, the step portion is prevented from being broken.

Subsequently, an application example of the example according to the present invention will be described. In the present application example, the groove 170 on the back side according to the above example is not formed, the semiconductor substrate is ground (back grinding) from the back side to the microgroove on the front side of the semiconductor substrate, and thereby the semiconductor substrate is divided. Specifically, instead of affixing of the tape for dicing in step S108 of FIG. 1, a tape for back grinding is affixed to the front side of the substrate. The tape for dicing may be used as the tape for back grinding as it is. Then, instead of the half dicing in step S110 of FIG. 1, the back grinding is performed up to the microgroove on the front side. The back side of the substrate is disposed so as to be seen in the same manner as in the half dicing, and, for example, by moving the rotating magnet in a horizontal direction or a perpendicular direction, the thickness of the entire substrate is thinned by the back grinding until the microgroove on the front side is exposed. The subsequent steps may be the same as those of FIG. 1. If the strength of the substrate after the back grinding decreases, only the peripheral portion of the substrate is not ground, and thereby the substrate may have a rib structure.

Here, in the step of the back grinding, vibration or cutting pressure is applied to an adhesive layer of the tape for back grinding through an internal wall of the microgroove by rotation of the magnet, or a relative movement between the magnet and the semiconductor substrate. If the semiconductor substrate is pressed by the cutting pressure, the adhesive layer with viscosity flows into the microgroove. In addition, as the vibration is transferred to the vicinity of the microgroove, a flow of the adhesive layer is expedited. Particularly, if the microgroove is a fine groove with a width of approximately several μm to approximately a dozen μm, the adhesive layer easily and deeply enters into the microgroove, and if the width is equal to or smaller than 10 μm, the effect is more remarkable.

If grinding performed by the magnet is completed, the tape for expanding is affixed to the back side of the substrate, and the tape for back grinding is irradiated with ultraviolet light. The adhesive layer to which the ultraviolet light is applied is cured, adhesive force thereof is lost, and the tape for back grinding is removed from the front side of the substrate. Here, the adhesive layer which enters into the microgroove on the surface side may remain in the groove or on the front surface of the substrate, when the tape for back grinding is removed, as illustrated in FIG. 6. Thus, in order to prevent the adhesive layer from remaining at the time when the tape for back grinding is removed, the microgrooves according to the example illustrated in FIGS. 7A to 7D and FIGS. 10A to 10D may be applied. If the microgrooves of FIGS. 7A to 7D and FIGS. 10A to 10D may be applied, not only the adhesive layer is prevented from remaining, but also a deeper groove is formed, and the strength of the semiconductor piece for ensuring the thickness of the semiconductor piece after the grinding is easily ensured.

In the present application example, the semiconductor substrate is ground from the back side up to the microgroove on the front side of the semiconductor substrate, and thereafter, the remaining part is divided by applying stress such as tensile stress or bending stress to the semiconductor substrate, and thereby the semiconductor substrate may be divided.

In addition, in the fabrication method performed by the aforementioned application example, during forming of the groove on the front side, the dry etching is switched to a second etching strength which is a greater etching strength than the first etching strength and in which a width of an entry portion of the groove on the front side is not widened and downwardly extends, and a groove on the front side which has no portion whose width is widened toward a lower portion of the groove may be formed. In the configuration, a reverse tapered shape or the like in which an adhesive layer easily remains is not formed, and thus, even if a depth into which the adhesive layer of the tape enters becomes deep, the adhesive layer is prevented from remaining.

As described above, a preferred exemplary embodiment according to the present invention is described, but the present invention is not limited to a specific exemplary embodiment, and various modifications and changes may be made within the scope of the present invention described in the claims.

For example, the groove 170 on the back side may be formed in a depth which reaches the vicinity of the microgroove on the front side but does not communicate with the microgroove on the surface side. That is, in the step in which the groove 170 on the back side of FIG. 3B is formed, a part of the thickness of the semiconductor substrate may form the groove 170 on the back side. In this case, in the subsequent steps, the semiconductor substrate may be divided by applying stress such as tensile stress or bending stress to the semiconductor substrate thereby dividing the remaining portion. In addition, if the first groove portion (upper portion side of the microgroove on the front side) is a forward tapered shape, the second groove portion (lower portion side of the microgroove on the front side) may have a wider width than the width of the lowermost portion of the first groove portion. For example, in a case or the like in which a depth into which the adhesive layer enters is grasped in advance, a shape of the microgroove in a deeper portion than a depth into which the adhesive layer enters may be a shape which is wide in a depth direction. In other words, the second groove portion may have a shape whose width is wider toward a lower portion than a width of the lowermost portion of the first groove portion. This is because, if the width of the first groove portion is deeper than the depth into which the adhesive layer enters, abnormality such as that ultraviolet light is hardly applied is expedited even if the second groove portion has a shape which is widened in a depth direction. Then, rather, by having the shape which is widened in the depth direction, an area of the back side of the diced semiconductor piece is reduced, and protrusion or crawling-up of the adhesive member is prevented in a case in which the semiconductor piece is mounted on a circuit board or the like. When a flow amount of gas which is included in etching gas and is used for forming a protective film, or a flow amount of gas for etching is switched, the shape is formed by switching in such a manner that etching strength becomes stronger. In this case, it is preferable that the flow amount of the gas is switched in a range in which an angle portion is not formed in a side wall of the groove. It is not necessary for the microgroove on the front side to be formed only by the first and second groove portions, and a third groove portion may be included in the lower portion of the second groove portion. In this case, the third groove portion may have a greater width than that of the second groove portion.

In addition, the fabrication method according to the present invention may be applied to a case in which each element is diced from a substrate which does not include a semiconductor such as glass or polymer.

Prevention of damage of the present invention is not limited to the extent that missing, cracking, or the like can be visually confirmed, and includes slight prevention of breakage, or a slight decrease of breakability, regardless of the degree of prevention. In addition, prevention of remaining of the adhesive layer does not mean that remaining is completely prevented, and includes slight prevention of remaining or a slight decrease of possible remaining, regardless of the degree of prevention. In addition, the microgrooves according to the present example of FIGS. 7A to 7D, and FIGS. 10A to 10D are just an example, and all types of the method of forming by switching etching strength may be used regardless of a shape or angle of tilt thereof.

What is claimed is:

1. A fabrication method of a semiconductor piece comprising:
   forming a groove that has a first groove portion whose width is gradually narrowed from a front side of a substrate toward a back side of the substrate, and a second groove portion which is a groove portion formed to communicate with a lower part of the first groove portion and extends toward a lower part at a steeper angle than an angle of the first groove portion, has a shape without an angle portion between the first groove portion and the second groove portion, is positioned on the front side, and is formed by dry etching;
   affixing a retention member including an adhesive layer to the front side in which the groove on the front side is formed;
   thinning the substrate from the back side of the substrate in a state in which the retention member is affixed; and
   removing the retention member from the front side after the thinning.

2. The fabrication method of a semiconductor piece according to claim 1, further comprising:
   forming the groove on the front side by starting formation of the groove on the front side by the dry etching with etching strength by which a width of the groove on the front side is gradually narrowed toward the back side, and, during formation of the groove on the front side, switching a flow amount of gas for forming a protective film included in etching gas which is used for the dry etching, from a first flow amount to a second flow amount which is less than the first flow amount in a range without stopping a flow amount of the gas for forming the protective film.

3. The fabrication method of a semiconductor piece according to claim 1, further comprising:
   forming the groove on the front side by starting formation of the groove on the front side by the dry etching with etching strength by which a width of the groove on the front side is gradually narrowed toward the back side, and, during formation of the groove on the front side, switching a flow amount of gas for etching included in etching gas which is used for the dry etching, from a first flow amount to a second flow amount which is more than the first flow amount.

4. The fabrication method of a semiconductor piece according to claim 1,
   wherein the second groove portion has a shape whose width is not wider than a width of a lowermost portion of the first groove portion, and which downwardly extends.

5. The fabrication method of a semiconductor piece according to claim 1,
   wherein a depth of the first groove portion is deeper than a depth into which the adhesive layer enters, and
   wherein the second groove portion has a shape whose width is wider than a width of a lowermost portion of the first groove portion toward a lower part.

6. A fabrication method of a semiconductor piece comprising:
   forming a groove that has a first groove portion whose width is gradually narrowed from a front side of a substrate toward a back side of the substrate, and a second groove portion which is a groove portion formed to communicate with a lower part of the first groove portion and extends toward a lower part at a steeper angle than an angle of the first groove portion, has a shape without an angle portion between the first groove portion and the second groove portion, is positioned on the front side, and is formed by dry etching;

affixing a retention member including an adhesive layer to the front side in which the groove on the front side is formed;

forming a groove on a back side using a cutting member which rotates from the back side of the substrate toward the groove on the front side, in a state in which the retention member is affixed; and removing the retention member from the front side after the groove on the back side is formed.

7. The fabrication method of a semiconductor piece according to claim 6, further comprising:

forming the groove on the front side by starting formation of the groove on the front side by the dry etching with etching strength by which a width of the groove on the front side is gradually narrowed toward the back side, and, during formation of the groove on the front side, switching a flow amount of gas for forming a protective film included in etching gas which is used for the dry etching, from a first flow amount to a second flow amount which is less than the first flow amount in a range without stopping a flow amount of the gas for forming the protective film.

8. The fabrication method of a semiconductor piece according to claim 6, further comprising:

forming the groove on the front side by starting formation of the groove on the front side by the dry etching with etching strength by which a width of the groove on the front side is gradually narrowed toward the back side, and, during formation of the groove on the front side, switching a flow amount of gas for etching included in etching gas which is used for the dry etching, from a first flow amount to a second flow amount which is more than the first flow amount.

9. The fabrication method of a semiconductor piece according to claim 6, wherein the second groove portion has a shape whose width is not wider than a width of a lowermost portion of the first groove portion, and which downwardly extends.

10. The fabrication method of a semiconductor piece according to claim 6, wherein a depth of the first groove portion is deeper than a depth into which the adhesive layer enters, and wherein the second groove portion has a shape whose width is wider than a width of a lowermost portion of the first groove portion toward a lower part.

* * * * *